United States Patent
Chen et al.

(10) Patent No.: US 10,356,937 B2
(45) Date of Patent: Jul. 16, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/114,553

(22) Filed: Aug. 28, 2018

(65) Prior Publication Data

US 2018/0368278 A1    Dec. 20, 2018

Related U.S. Application Data

(63) Continuation of application No. 15/284,719, filed on Oct. 4, 2016.

(30) Foreign Application Priority Data

Jan. 6, 2016  (TW) .............................. 105100358 A
May 31, 2016  (TW) .............................. 105117125 A (51) Int. Cl.
*H05K 7/18* (2006.01)
*F16C 29/00* (2006.01)
(Continued)

(52) U.S. Cl.
CPC ........... *H05K 7/183* (2013.01); *A47B 88/427* (2017.01); *A47B 88/43* (2017.01); *A47B 88/483* (2017.01);
(Continued)

(58) Field of Classification Search
CPC ...... H05K 7/183; H05K 7/1489; A47B 88/49; A47B 88/044; A47B 88/08; A47B 2210/0059; F16C 29/002
See application file for complete search history.

(56) References Cited

U.S. PATENT DOCUMENTS 5,542,759 A    8/1996  Krivec
6,578,939 B1   6/2003  Mayer
(Continued)

FOREIGN PATENT DOCUMENTS

JP    3171398 U    10/2011
JP    3171621 U    11/2011
(Continued)

*Primary Examiner* — Hanh V Tran
(74) *Attorney, Agent, or Firm* — Rosenberg, Klein & Lee (57) ABSTRACT

A slide rail assembly for mounting a chassis to a rack is provided. The chassis has multiple mounting members on a lateral side. The slide rail assembly is mounted on the rack by two brackets and includes first and second rails, a first auxiliary supporting member, and multiple reinforcing segments. The first rail has first and second sides, wherein the first side has a concave space. The second rail can be displaced with respect to the first rail and has an inner side and an outer side. The first auxiliary supporting member is mounted in the concave space of the first side of the first rail. The reinforcing segments are fixedly mounted on the inner side of the second rail.

17 Claims, 12 Drawing Sheets

(51) Int. Cl.
  *H05K 7/14*    (2006.01)
  *A47B 88/49*   (2017.01)
  *A47B 88/43*   (2017.01)
  *A47B 88/427*  (2017.01)
  *A47B 88/483*  (2017.01)

(52) U.S. Cl.
  CPC ............ *A47B 88/49* (2017.01); *F16C 29/002* (2013.01); *H05K 7/1489* (2013.01); *A47B 2210/0059* (2013.01)

(56) References Cited

U.S. PATENT DOCUMENTS

| | | |
|---|---|---|
| 2006/0152115 A1 | 7/2006 | Dubon et al. |
| 2012/0087606 A1 | 4/2012 | Chen et al. |
| 2012/0106880 A1 | 5/2012 | Chen et al. |
| 2013/0058596 A1 | 3/2013 | Chen et al. |
| 2014/0265786 A1 | 9/2014 | Chen et al. |

FOREIGN PATENT DOCUMENTS

| | | |
|---|---|---|
| JP | 3191407 U | 6/2014 |
| TW | 201208542 A1 | 2/2012 |
| TW | 201215350 A1 | 4/2012 |

SLIDE RAIL ASSEMBLY

CROSS-REFERENCE TO RELATED APPLICATIONS

This application is a continuation of application Ser. No. 15/284,719, filed on Oct. 4, 2016, currently pending.

FIELD OF THE INVENTION

The present invention relates to a slide rail assembly and more particularly to one that includes a plurality of reinforcing segments configured to increase the structural strength of a rail without increasing the width of the entire assembly.

BACKGROUND OF THE INVENTION

U.S. Pat. No. 6,578,939, granted to Mayer, discloses "Universal sliding rail assembly for rack mounting computers". According to FIG. 1 accompanying the specification of this US patent, a slide rail assembly includes an outer rail (102), a middle rail (104) slidably connected to the outer rail (102), an inner rail (106) slidably connected to the middle rail (104), and a bracket (200) movably connected to the outer rail (102). This slide rail assembly, however, does not have a rail reinforcing structure. In view of the drawbacks of a slide rail assembly without a reinforcing structure, Dubon et al. disclose "Adjustable reinforcing bracket for telescoping slide rail assembly" in US Published Patent Application No. 2006/0152115 A1. The telescoping slide rail assembly disclosed in the US published patent application of Dubon et al. includes a stationary slide rail 22, which includes a wall with an outer surface. The two ends of the stationary slide rail 22 can be mounted to a pair of posts of a rack via the mounting elements 26, 40 respectively. The telescoping slide rail assembly further includes a reinforcing element 32 connected to the outer surface of the wall of the stationary slide rail 22 and a mounting slide rail 34 slidably connected to the reinforcing element 32.

Figures 1, 1A:
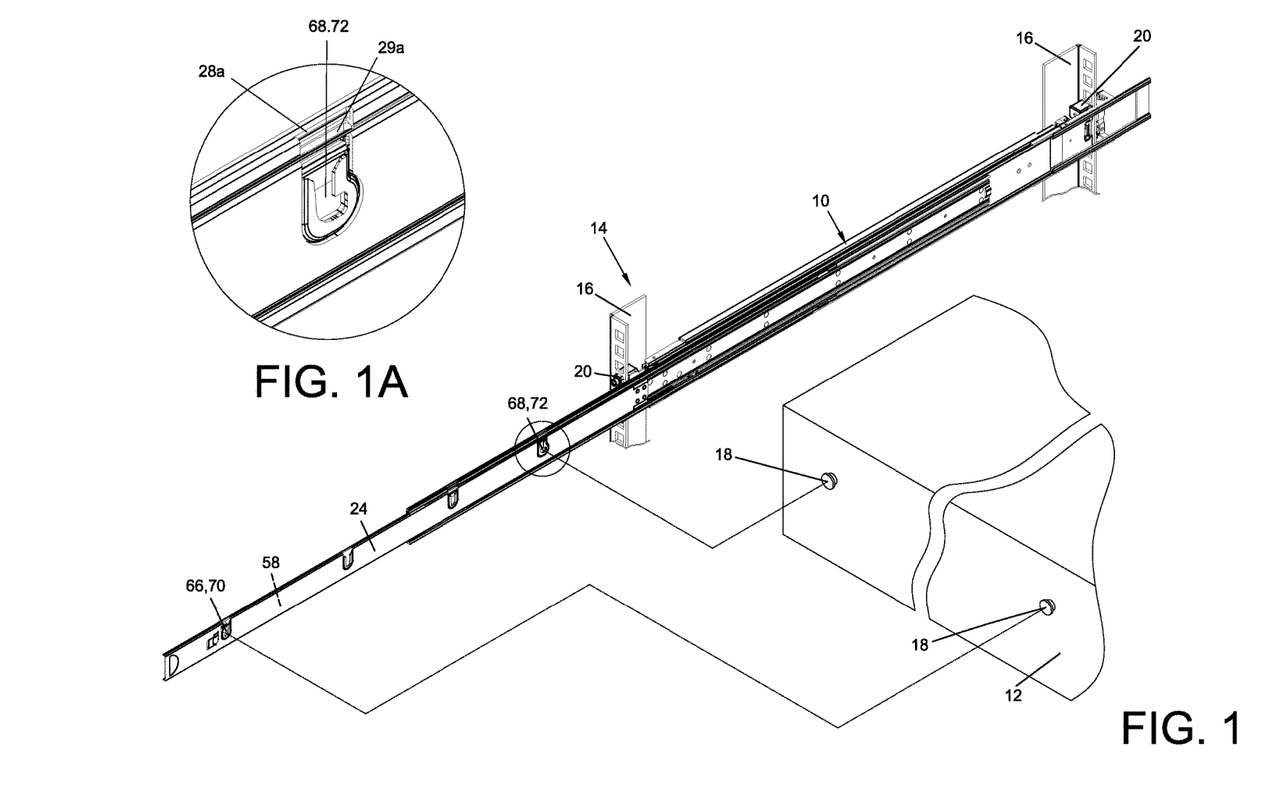
FIG. 1 is a perspective view showing how a chassis is mounted to the slide rail assembly in an embodiment of the present invention.
FIG. 1A is an enlarged view of the circled area in FIG. 1.
Figure 8:
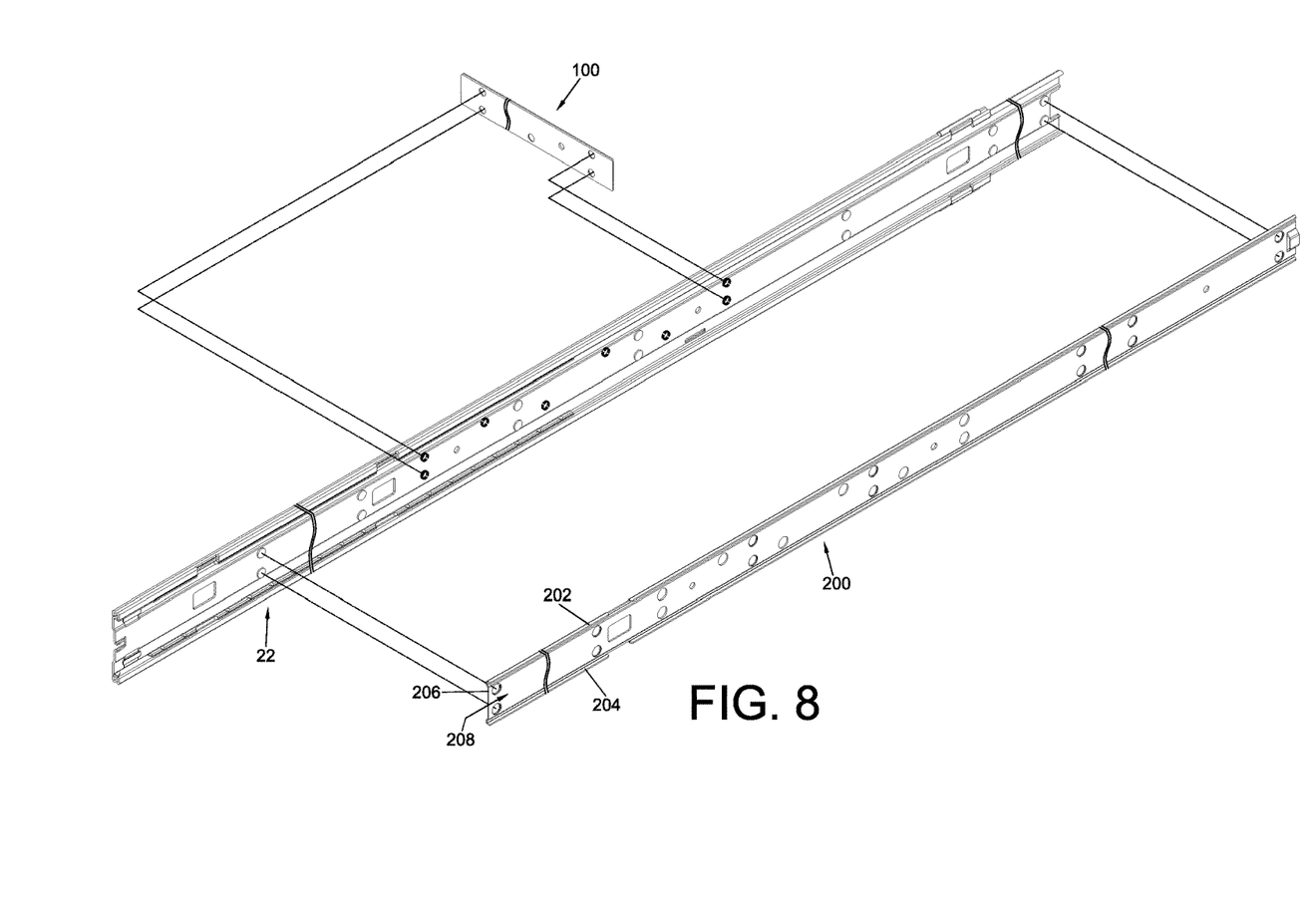
FIG. 8 is an exploded perspective view showing how a first auxiliary supporting member and a second auxiliary supporting member are mounted to two lateral sides of the first rail in the embodiment of FIG. 1 respectively.

According to FIG. 1 and FIG. 8 accompanying the specification of the US published patent application of Dubon et al., the reinforcing element 32, which is configured to reinforce the stationary slide rail 22 and is connected to the stationary slide rail 22 along with the mounting slide rail 34, adds to the width of the telescoping slide rail assembly. Therefore, when it is desired to mount a pair of such telescoping slide rail assemblies respectively at two corresponding positions of a rack, whose internal space is limited, the width of the reinforced slide rail assemblies tends to hinder the mounting process, if not rendering the slide rail assemblies inapplicable. That is to say, the telescoping slide rail assembly disclosed in the US published patent application of Dubon et al. may have problem being put to industrial use.

A better design is hence desired to overcome the shortcomings stated above of the prior art.

SUMMARY OF THE INVENTION

It is an objective of the present invention to provide a slide rail assembly in which a first rail is reinforced by a first auxiliary supporting member provided in a concave space of a first side of the first rail.

Another objective of the present invention is to provide a slide rail assembly in which reinforcing segments are provided to increase the structural strength of a rail under the limitation on width.

According to one aspect of the present invention, a slide rail assembly includes a first rail, a second rail, and a first auxiliary supporting member. The first rail has a first side and a second side, wherein the first side has a concave space. The second rail can be displaced with respect to the first rail in a longitudinal direction. The first auxiliary supporting member is mounted in the concave space of the first side of the first rail.

Preferably, the first auxiliary supporting member is fixedly mounted in the concave space of the first side of the first rail.

Preferably, the slide rail assembly further includes a third rail. The third rail has an upper wall, a lower wall, and a sidewall connected between the upper wall and the lower wall. The upper wall, the lower wall, and the sidewall jointly define a passage, in which the first rail can be displaced. The first auxiliary supporting member is movably provided in the concave space of the first side of the first rail and is mounted on the first rail through cooperation between the first rail and the sidewall of the third rail.

Preferably, the slide rail assembly further includes a second auxiliary supporting member fixedly mounted on the second side of the first rail.

Preferably, the first rail has a cross section of a first thickness, the second auxiliary supporting member has a cross section of a second thickness, and the first thickness is slightly greater than the second thickness.

Preferably, the second auxiliary supporting member has a first wall, a second wall, and a third wall connected between the first wall and the second wall. The first wall, the second wall, and the third wall jointly define an auxiliary passage. A reinforcing member is mounted on an inner side of the second rail and is received in the auxiliary passage.

According to another aspect of the present invention, a slide rail assembly includes a first rail, a second rail, and a plurality of reinforcing segments. The second rail can be displaced with respect to the first rail in a longitudinal direction. The second rail includes an inner side, an outer side, and a plurality of mounting features, wherein the inner side corresponds to the first rail. The reinforcing segments are fixedly mounted on the inner side of the second rail and each have at least one matching feature. Each matching feature of the reinforcing segments corresponds to one of the mounting features of the second rail.

Preferably, the reinforcing segments are integrated to form a reinforcing member.

Preferably, the slide rail assembly further includes a third rail, with respect to which the first rail can be displaced in the longitudinal direction.

Preferably, the mounting features of the second rail include a plurality of U-shaped holes and a J-shaped hole. The J-shaped hole is adjacent to one end of the second rail.

Preferably, the matching features of the reinforcing segments include a plurality of U-shaped corresponding holes and a J-shaped corresponding hole. These U-shaped corresponding holes and J-shaped corresponding hole of the reinforcing segments correspond to the U-shaped holes and the J-shaped hole of the second rail respectively.

Preferably, the reinforcing member has a first length, the second rail has a second length, and the first length is substantially equal to or slightly less than the second length.

Preferably, the reinforcing member has a cross section of a first thickness, the second rail has a cross section of a second thickness, and the first thickness is less than the second thickness.

Preferably, the slide rail assembly further includes an elastic plate that extends transversely, and at an angle, from the reinforcing member toward the first rail; the first rail has a first engaging feature; and the elastic plate has a second engaging feature. Once the second rail is displaced from a first position to a second position with respect to the first rail, the first engaging feature is engaged with the second engaging feature.

According to still another aspect of the present invention, a slide rail assembly for mounting a chassis to a rack is provided, wherein the chassis has a lateral side arranged with a plurality of mounting members. The slide rail assembly, mounted on the rack via a pair of brackets, includes a first rail, a second rail, and a reinforcing member. The first rail has a first upper wall, a first lower wall, and a first sidewall connected between the first upper wall and the first lower wall. The first upper wall, the first lower wall, and the first sidewall jointly define a first passage. The second rail can be displaced with respect to the first passage of the first rail and has a second upper wall, a second lower wall, and a second sidewall connected between the second upper wall and the second lower wall. The reinforcing member is fixedly mounted on the second sidewall of the second rail and has a first length. The second rail has a second length. The first length is substantially equal to or slightly less than the second length.

DETAILED DESCRIPTION OF THE INVENTION

Referring to FIG. 1, the slide rail assembly 10 in an embodiment of the present invention is configured to mount a chassis 12 to a rack 14. The rack 14 includes a pair of posts 16 on one side. A plurality of mounting members 18 are arranged on one side of the chassis 12. The slide rail assembly 10 is mounted between the pair of posts 16 of the rack 14 via a pair of brackets 20. The chassis 12 is mounted to the slide rail assembly 10 via the mounting members 18.

Figure 2:
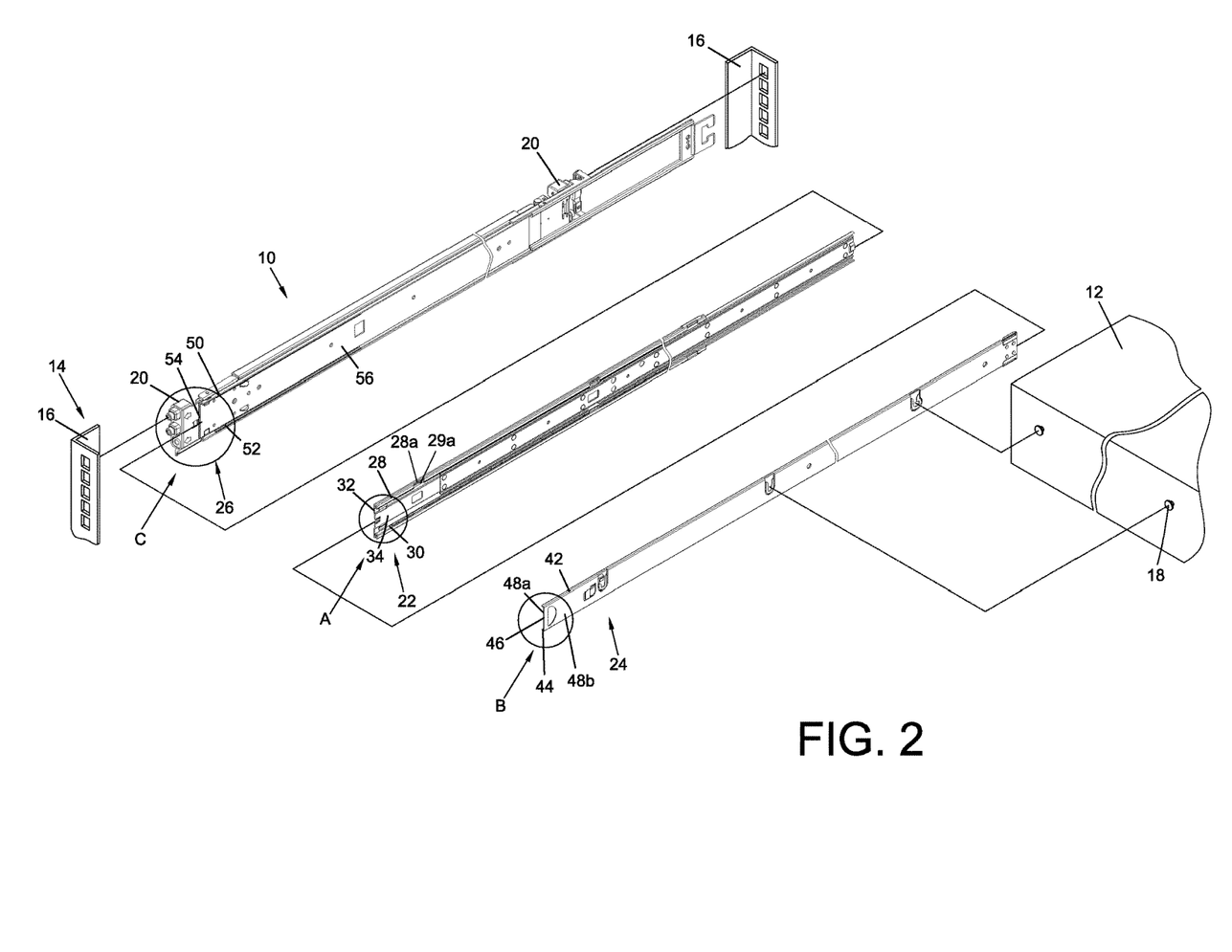
FIG. 2 is an exploded perspective view of the slide rail assembly, the chassis, and the rack in FIG. 1.
Figure 3:
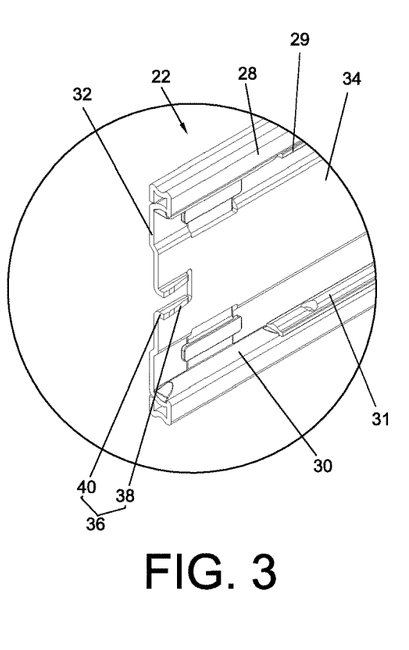
FIG. 3 is an enlarged view of the circled area A in FIG. 2.

As shown in FIG. 2, the slide rail assembly 10 includes a first rail 22, a second rail 24, and a third rail 26. As shown in FIG. 3, the first rail 22 has a first upper wall 28, a first lower wall 30, and a first sidewall 32 connected between the first upper wall 28 and the first lower wall 30. The first upper wall 28, the first lower wall 30, and the first sidewall 32 jointly define a first passage 34. In a preferred embodiment, the front end of the first sidewall 32 of the first rail 22 has at least one first engaging feature 36, e.g., a projection. The at least one first engaging feature 36 has an inclined portion 38 and a stop portion 40 located at an upper end of the inclined portion 38. Preferably, the first upper wall 28 of the first rail 22 has an inner side provided with an upper supporting strip 29 for supporting the second upper wall 42 of the second rail 24, and the first lower wall 30 of the first rail 22 has an inner side provided with a lower supporting strip 31 for supporting the second lower wall 44 of the second rail 24. Moreover, the first upper wall 28 of the first rail 22 is provided with a first notch 28a, and the upper supporting strip 29 is provided with a second notch 29a corresponding in position to the first notch 28a. Both the first notch 28a and the second notch 29a correspond to a hole 68 of the second rail 24 so that one of the mounting members 18 of the chassis 12 can be mounted into the hole 68 as explained in more detail further below.

Figure 4:
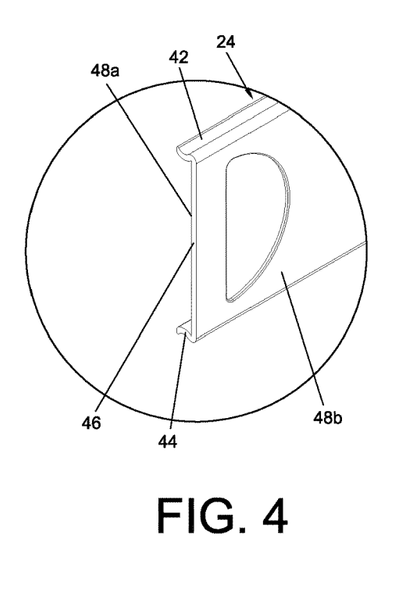
FIG. 4 is an enlarged view of the circled area B in FIG. 2.

As shown in FIG. 2 and FIG. 4, the second rail 24 can be displaced in the first passage 34 of the first rail 22 and has a second upper wall 42, a second lower wall 44, and a second sidewall 46 connected between the second upper wall 42 and the second lower wall 44. The second sidewall 46 of the second rail 24 has an inner side 48a and an outer side 48b. The inner side 48a corresponds to the first sidewall 32 of the first rail 22.

Figure 5:
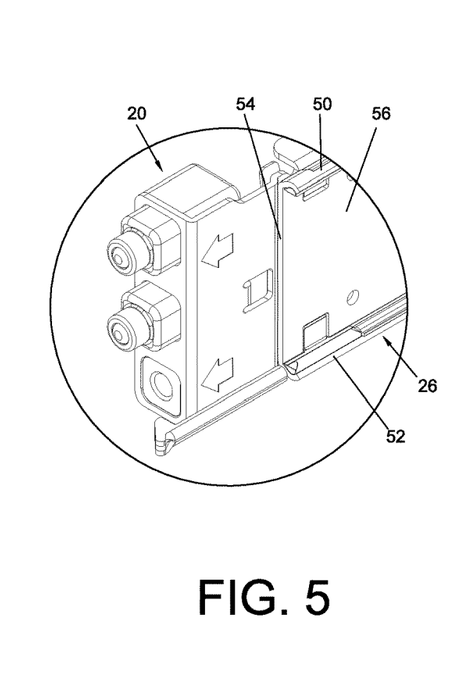
FIG. 5 is an enlarged view of the circled area C in FIG. 2.

As shown in FIG. 2 and FIG. 5, the third rail 26 has a third upper wall 50, a third lower wall 52, and a third sidewall 54 connected between the third upper wall 50 and the third lower wall 52. The third upper wall 50, the third lower wall 52, and the third sidewall 54 jointly define a second passage 56, in which the first rail 22 can be displaced.

Figure 6:
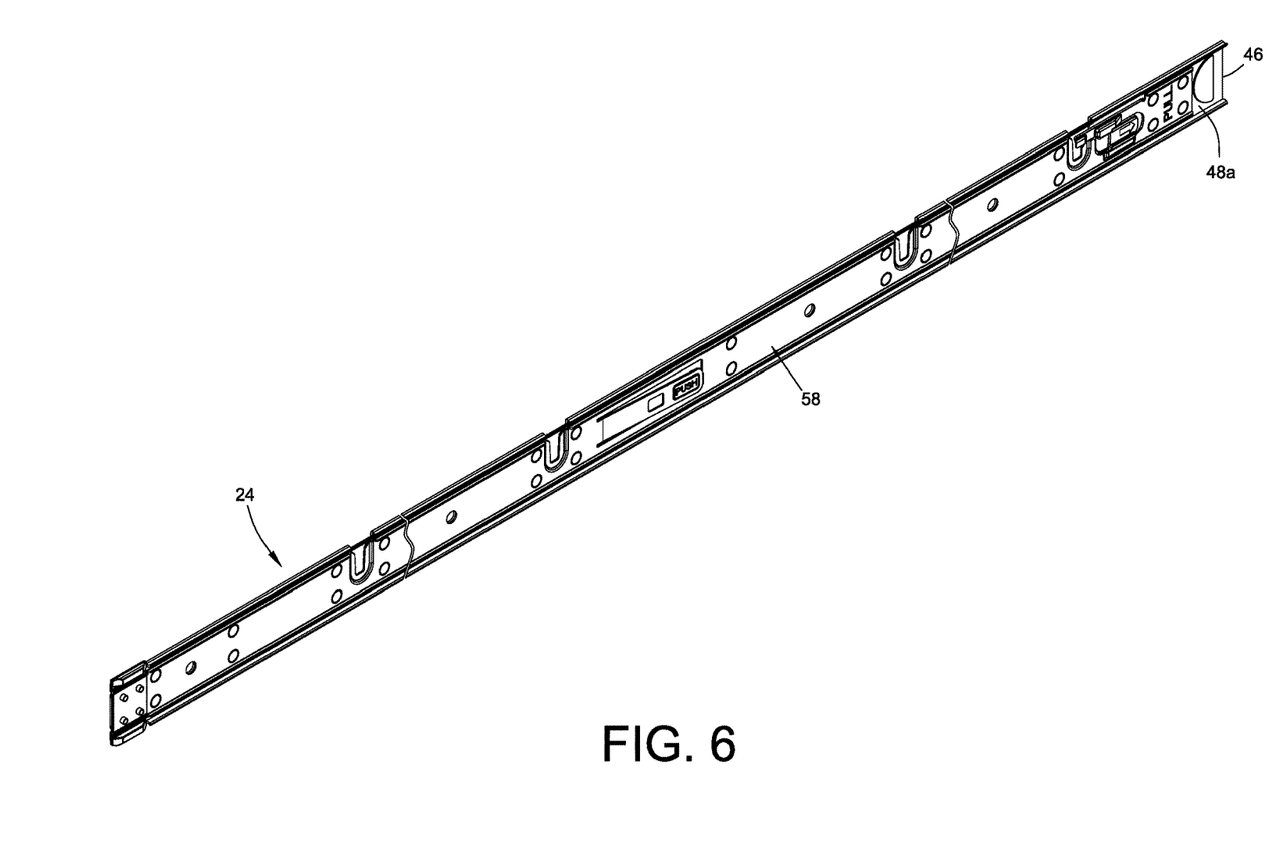
FIG. 6 is a perspective view showing how a reinforcing member is mounted on the second rail in the embodiment of FIG. 1.
Figure 7:
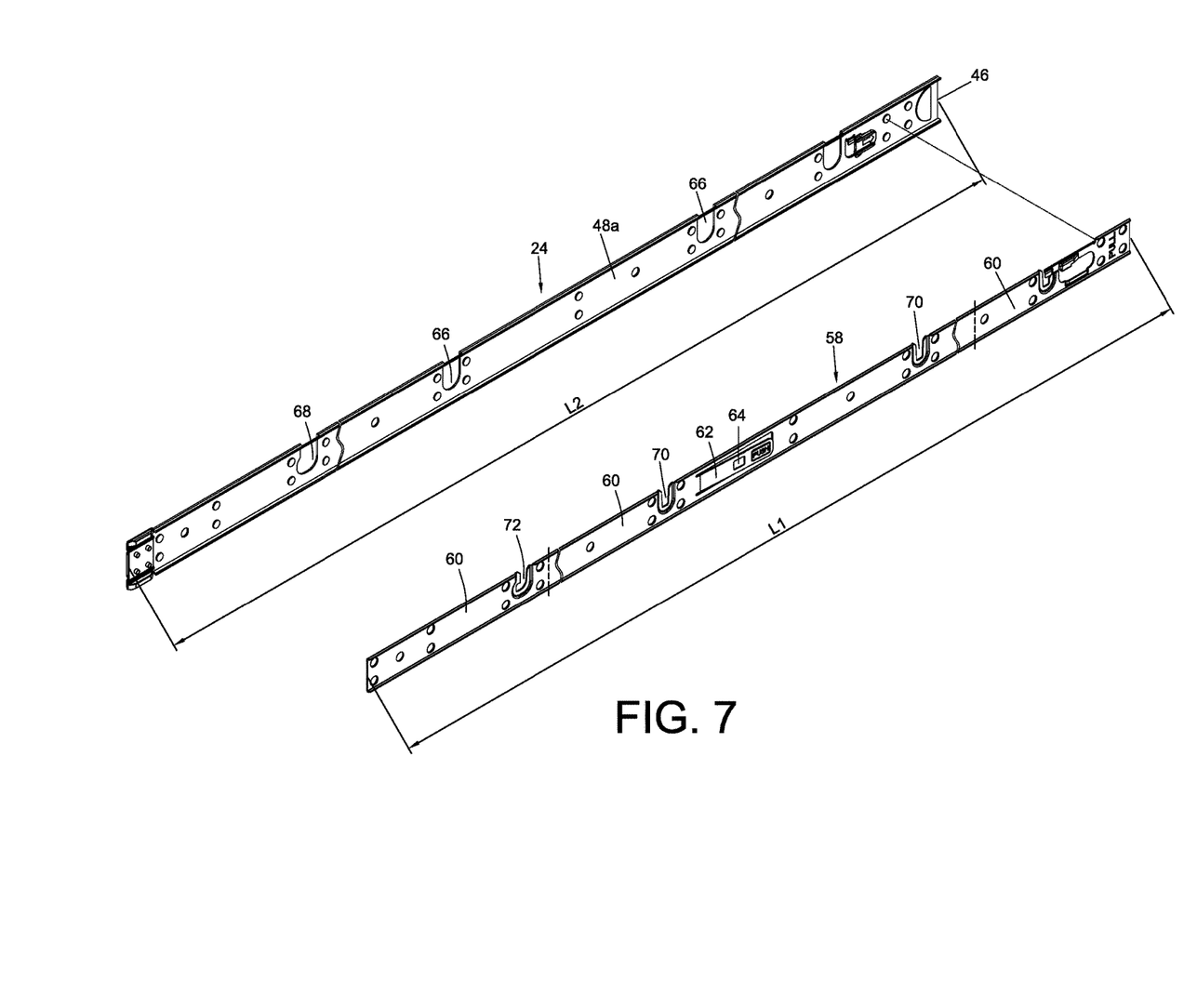
FIG. 7 is an exploded perspective view of the reinforcing member and the second rail in FIG. 6.

As shown in FIG. 6 and FIG. 7, a plurality of reinforcing segments 60 are fixedly mounted on the inner side 48a of the second sidewall 46 of the second rail 24 either directly or after the reinforcing segments 60 are integrated to form a reinforcing member 58. Preferably, the reinforcing member 58 has a first length L1, the second rail 24 has a second length L2, and the first length L1 is substantially equal to or slightly less than the second length L2 so that the second rail 24 is enhanced in rigidity almost along its entire length. A preferred embodiment of the present invention further includes an elastic plate 62 extending transversely, and at an angle, from the reinforcing member 58. The elastic plate 62 has a second engaging feature 64, e.g., an engaging hole. In addition, the second rail 24 has a plurality of mounting features, which include a plurality of U-shaped holes 66 and a J-shaped hole 68. The J-shaped hole 68 is adjacent to one end of the second rail 24. The reinforcing member 58, on the other hand, has a plurality of matching features, which include a plurality of U-shaped corresponding holes 70 and a J-shaped corresponding hole 72. The U-shaped corresponding holes 70 correspond to the U-shaped holes 66 of the second rail 24 respectively. The J-shaped corresponding hole 72 corresponds to the J-shaped hole 68 of the second rail 24.

Figure 9:
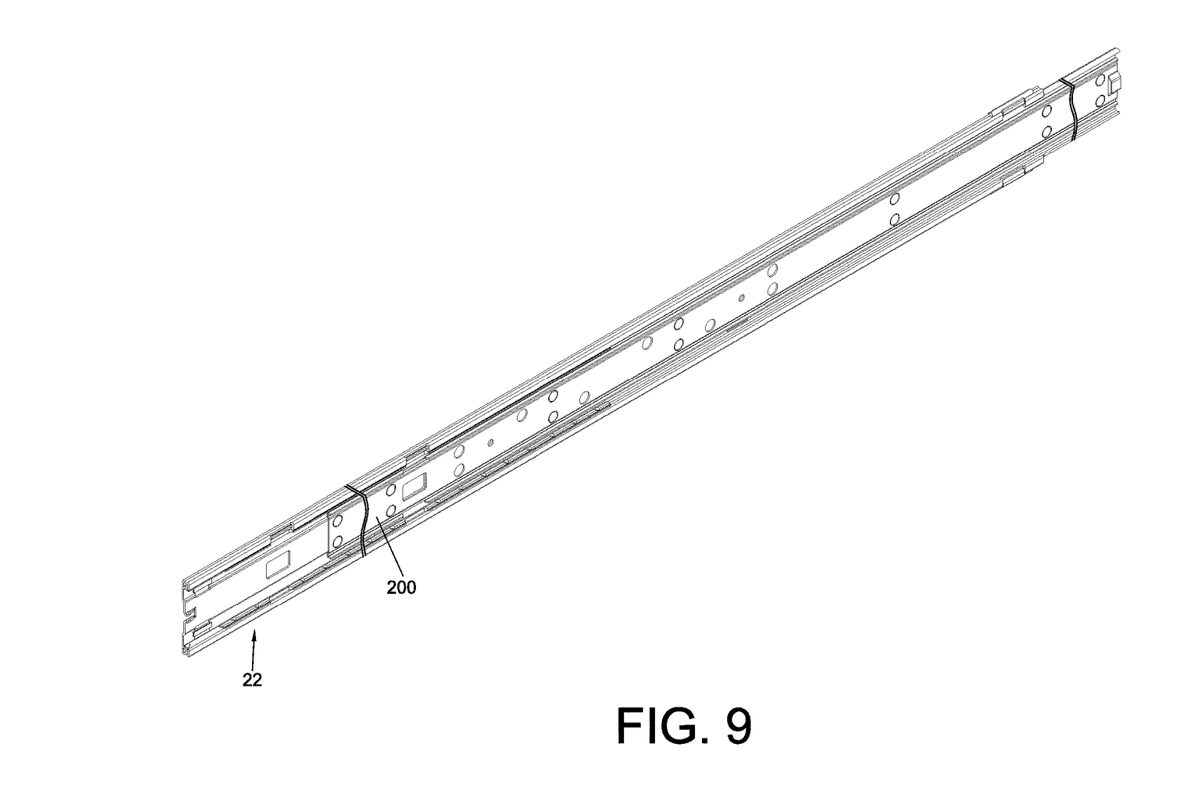
FIG. 9 is an assembled perspective view of the first auxiliary supporting member, the second auxiliary supporting member, and the first rail in FIG. 8.
Figure 10:
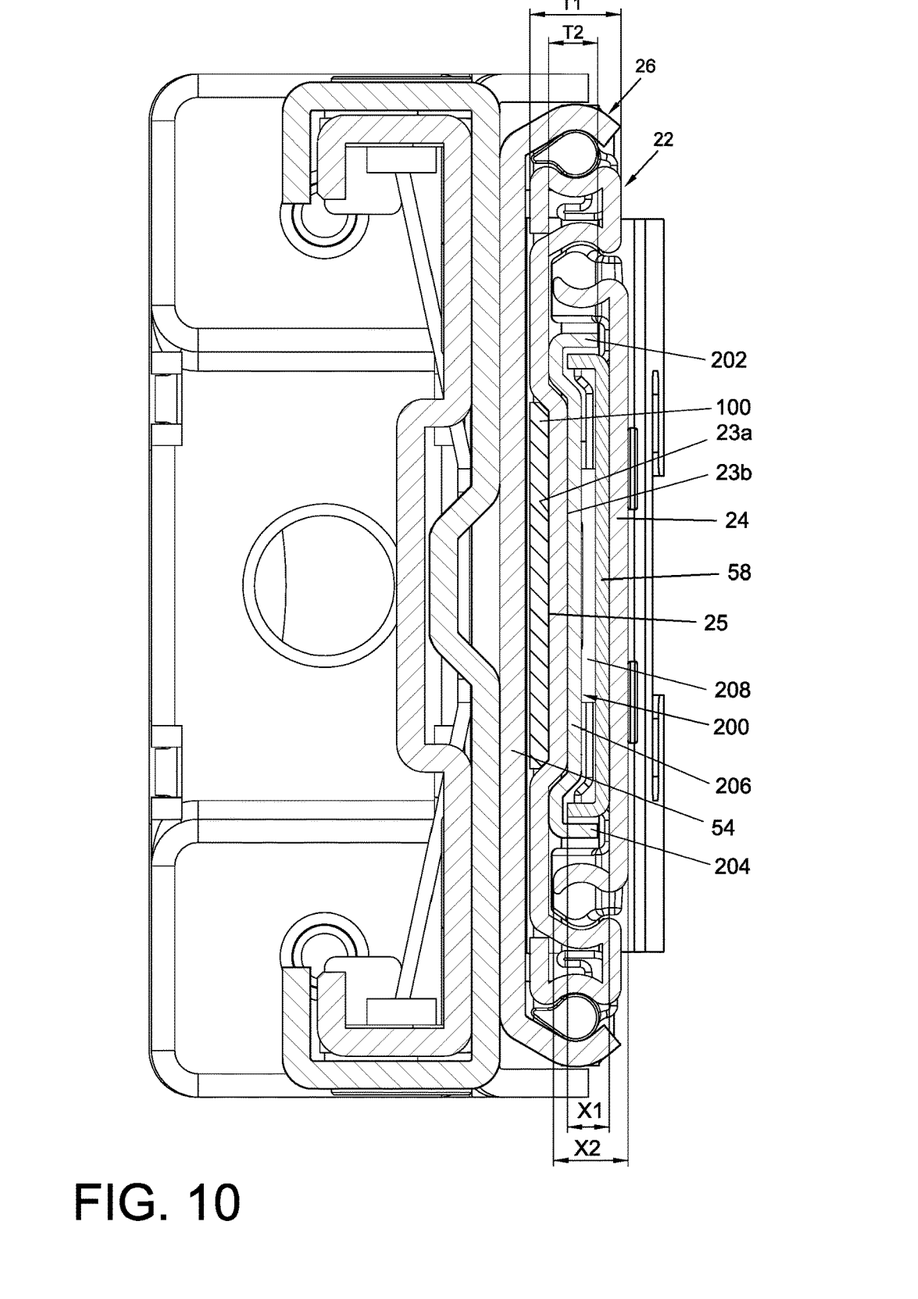
FIG. 10 is a sectional view the slide rail assembly in FIG. 1.

As shown in FIG. 8 to FIG. 10, the first rail 22 of the present invention is mounted with a first auxiliary supporting member 100 and a second auxiliary supporting member 200 on two opposite sides respectively. More specifically, the first rail 22 has a first side 23a formed with a concave space 25, and the first auxiliary supporting member 100 can be mounted in the concave space 25 of the first side 23a of the first rail 22 by a fixing means such as riveting or soldering. Or, the first auxiliary supporting member 100 is movably provided in the concave space 25 of the first side 23a of the first rail 22 and is mounted on the first rail 22 thanks to the first rail 22 cooperating with the third sidewall 54 of the third rail 26. In either case, the first auxiliary supporting member 100 serves to increase the supporting strength of the first rail 22. The second auxiliary supporting member 200, on the other hand, is fixedly mounted on a second side 23b of the first rail 22. In a preferred embodiment, the cross section of the first rail 22 has a first thickness T1, the cross section of the second auxiliary supporting member 200 has a second thickness T2, and the first thickness T1 is slightly greater than the second thickness T2 so that the reinforced first rail 22 and consequently the entire slide rail assembly 10 are not increased in thickness. The second auxiliary supporting member 200 has a first wall 202, a second wall 204, and a third wall 206 connected between the first wall 202 and the second wall 204. The first wall 202, the second wall 204, and the third wall 206 jointly define an auxiliary passage 208 for receiving the reinforcing member 58.

It can be known from the above that the slide rail assembly 10 of the present invention uses the first auxiliary supporting member 100 and the second auxiliary supporting member 200 to increase the flexural strength of the first rail 22, and the reinforcing member 58 to increase the flexural strength of the second rail 24. Preferably, referring to FIG. 10, the cross section of the reinforcing member 58 has a first thickness X1, the cross section of the second rail 24 has a second thickness X2, and the first thickness X1 is less than the second thickness X2 so that the reinforced second rail 24 and consequently the entire slide rail assembly 10 are not increased in thickness. This enables the slide rail assembly 10 to carry a wider chassis than is allowed by its prior art counterparts.

Figure 11:
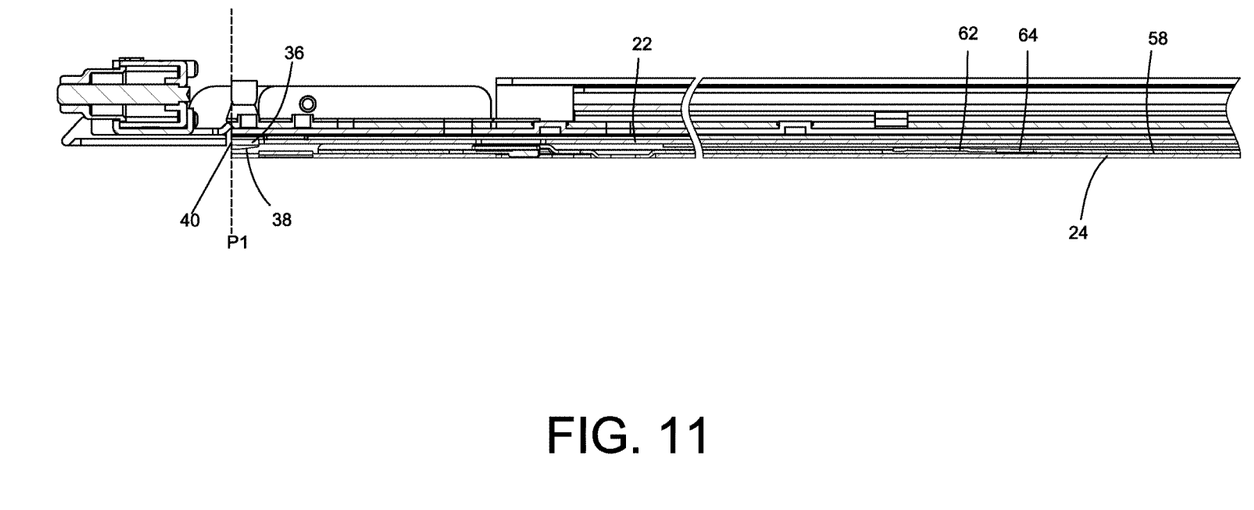
FIG. 11 is another sectional view of the slide rail assembly in FIG. 1, showing the second rail at a first position with respect to the first rail.
Figure 12:
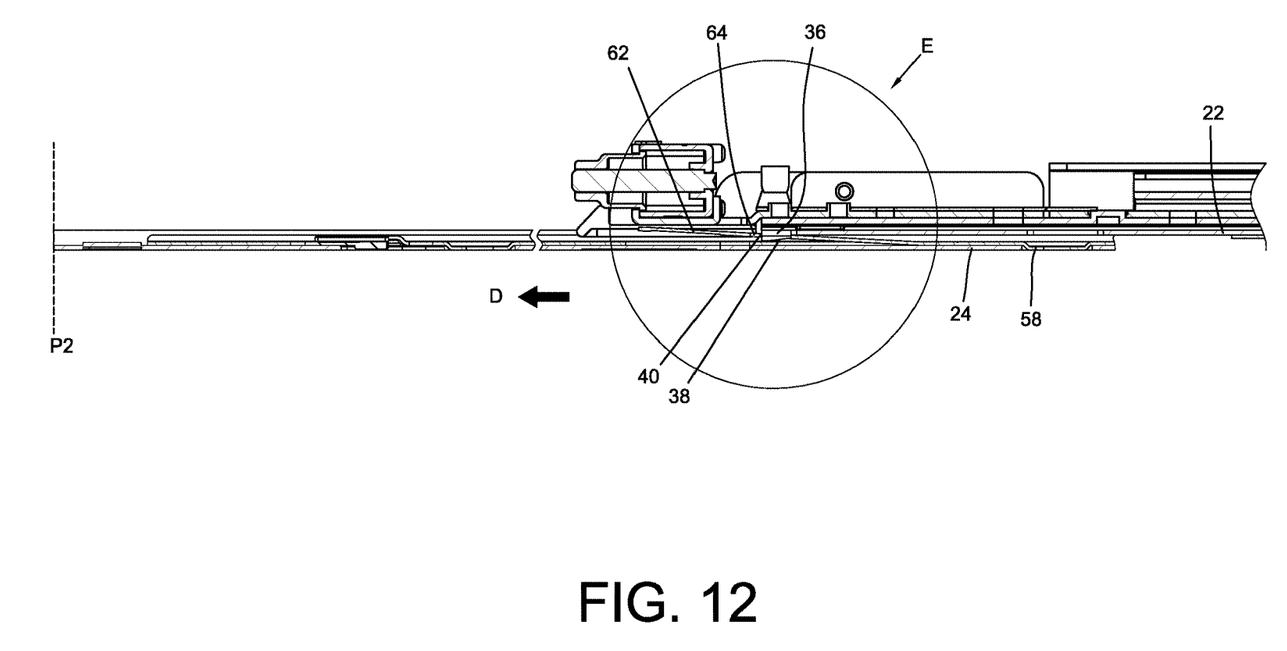
FIG. 12 is yet another sectional view of the slide rail assembly in FIG. 1, showing the second rail at a second position with respect to the first rail.
Figure 13:
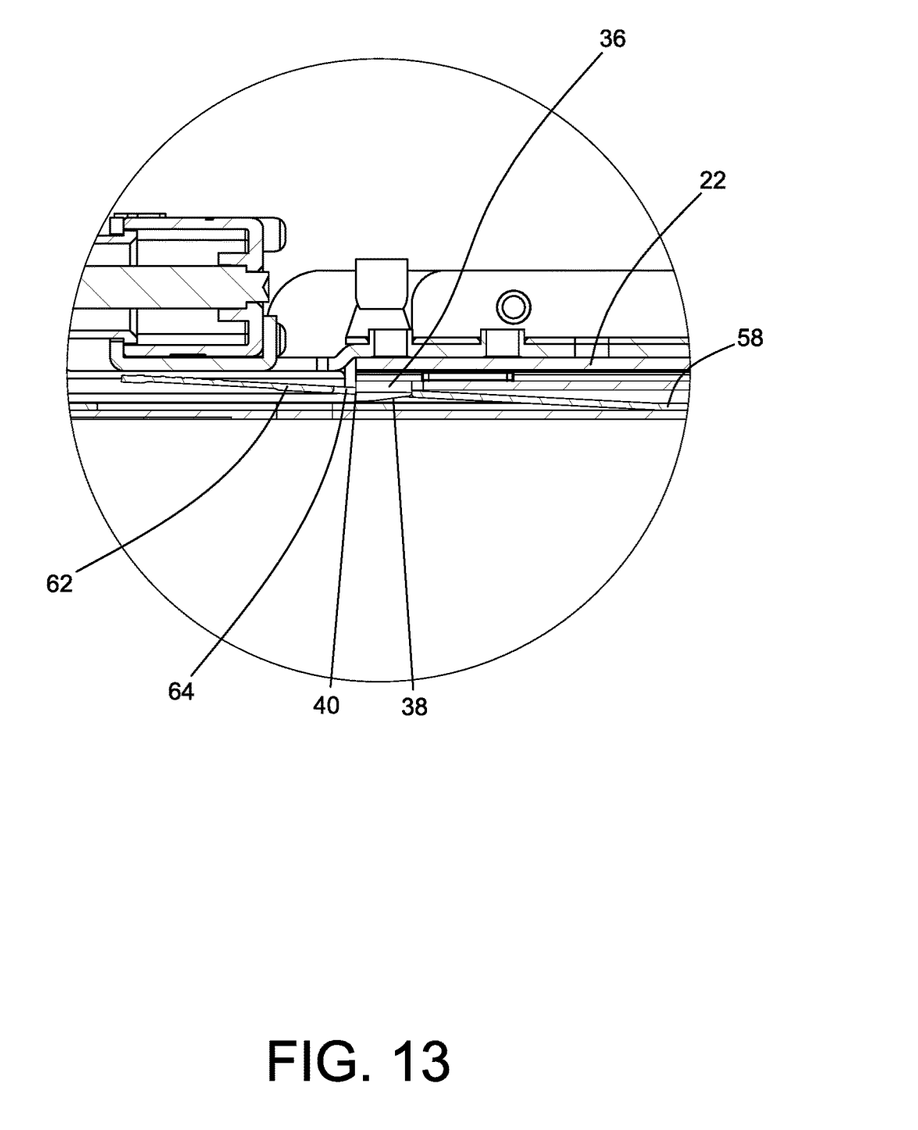
FIG. 13 is an enlarged view of the circled area E in FIG. 12.

Referring to FIG. 11 to FIG. 13, the second rail 24 can be displaced with respect to the first rail 22 in a longitudinal direction D. Once the second rail 24 is displaced to a second position P2 from a first position P1 with respect to the first rail 22, the first engaging feature 36 is engaged with and secured in position with respect to the second engaging feature 64. More specifically, during the displacement, the end of the elastic plate 62 of the reinforcing member 58 is moved past the inclined portion 38 of the first engaging feature 36 of the first rail 22. When the second engaging feature 64 of the elastic plate 62 of the reinforcing member 58 reaches a position corresponding to the first engaging feature 36 of the first rail 22, the elastic force of the elastic plate 62 of the reinforcing member 58 drives the first engaging feature 36 and the second engaging feature 64 into engagement. The stop portion 40 of the first engaging feature 36 can keep the second rail 24 in the engaged and secured state with respect to the first rail 22.

Figure 14:
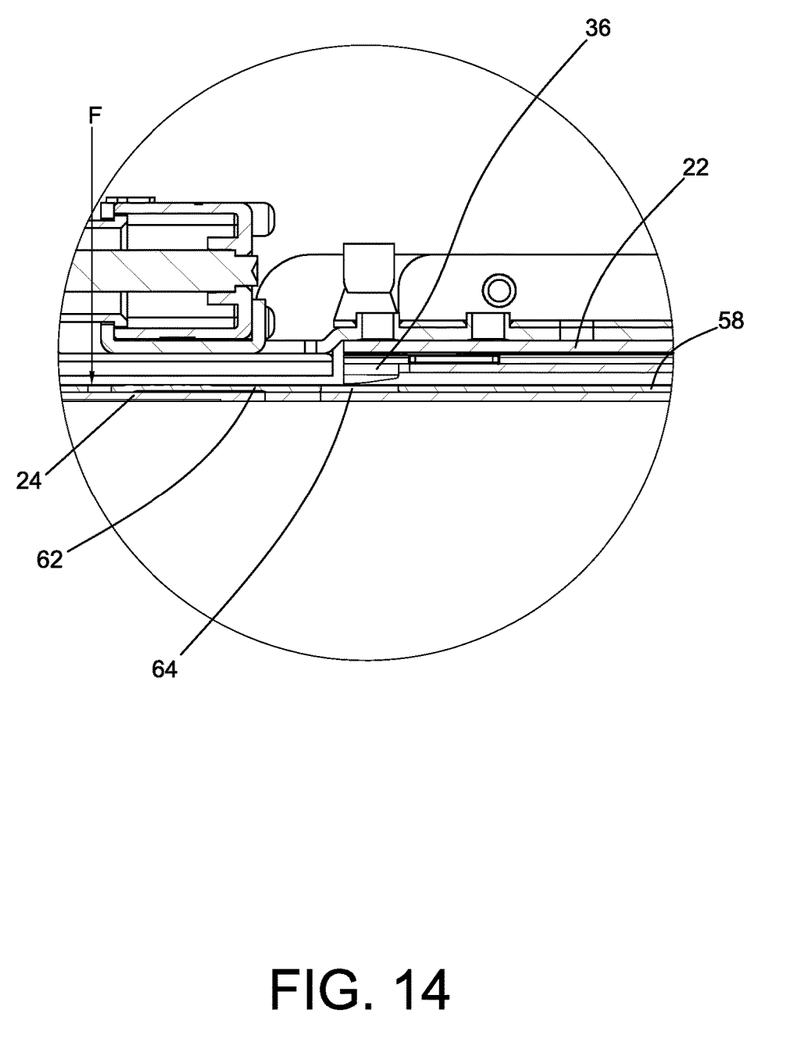
FIG. 14 shows how the second engaging feature in FIG. 13 is disengaged from the first engaging feature when the elastic plate is subjected to an external force.

Referring to FIG. 14, by applying a force F to the elastic plate 62 of the reinforcing member 58, the second engaging feature 64 of the elastic plate 62 is disengaged from the first engaging feature 36 of the first rail 22 so that the second rail 24 can be pushed and retracted with respect to the first rail 22.

According to the foregoing, the second rail 24 is reinforced in structure and has a functional design. Moreover, as shown in FIG. 1, the mounting members 18 of the chassis 12 can be mounted in the holes 66, 68 of the second rail 24 and the corresponding holes 70, 72 of the reinforcing member 58. To mount the chassis 12 to the slide rail assembly 10, the operator begins by bringing the rearmost mounting member 18 of the chassis 12 into engagement in the J-shaped hole 68 of the second rail 24 and the J-shaped corresponding hole 72 of the reinforcing member 58. After that, the remaining mounting members 18 of the chassis 12 can be brought into engagement in the U-shaped holes 66 of the second rail 24 and the U-shaped corresponding holes 70 of the reinforcing member 58 by the weight of the chassis 12. In consequence, the chassis 12 is mounted on the second rail 24 and is securely supported by the slide rail assembly 10.

While the present invention has been disclosed by the foregoing preferred embodiment, it is understood that the embodiment is not intended to be restrictive of the scope of the invention. Rather, the scope of patent protection sought by the applicant is defined by the appended claims.

What is claimed is:

1. A slide rail assembly, comprising:
   a first rail having a first side and a second side, wherein the first side forms a concave space;
   a second rail received in the second side of the first rail and displaceable with respect to the first rail in a longitudinal direction;
   a first auxiliary supporting member received to remain peripherally within the concave space of the first side of the first rail; and
   a third rail having an upper wall, a lower wall, and a sidewall connected between the upper wall and the lower wall; the upper wall, the lower wall, and the sidewall jointly define a passage, in which the first rail is displaceable; and the first auxiliary supporting member is provided in the concave space of the first side of the first rail and is mounted on the first rail through cooperation between the first rail and the sidewall of the third rail.

2. The slide rail assembly of claim 1, wherein the first auxiliary supporting member is fixedly mounted in the concave space of the first side of the first rail.

3. A slide rail assembly of claim 1, wherein the first auxiliary supporting member is movably provided in the concave space of the first side of the first rail.

4. The slide rail assembly of claim 1, further comprising a second auxiliary supporting member fixedly mounted on the second side of the first rail.

5. The slide rail assembly of claim 4, wherein the first rail has a cross section of a first thickness, the second auxiliary supporting member has a cross section of a second thickness, and the first thickness is slightly greater than the second thickness.

6. The slide rail assembly of claim 4, wherein the second auxiliary supporting member has a first wall, a second wall, and a third wall connected between the first wall and the second wall; the first wall, the second wall, and the third wall jointly define an auxiliary passage; and a reinforcing member is mounted on an inner side of the second rail and is received in the auxiliary passage.

7. The slide rail assembly of claim 1, further comprising a plurality of reinforcing segments fixedly mounted on an inner side of the second rail.

8. The slide rail assembly of claim 7, wherein the reinforcing segments are integrated to form a reinforcing member.

9. A slide rail assembly for mounting a chassis to a rack, wherein the slide rail assembly is configured to be mounted on the rack via a pair of brackets, the slide rail assembly comprising:
 a first rail having a first upper wall, a first lower wall, and a first sidewall connected between the first upper wall and the first lower wall, wherein the first upper wall, the first lower wall, and the first sidewall jointly define a passage;
 a second rail displaceable with respect to the passage of the first rail, the second rail having a second upper wall, a second lower wall, and a second sidewall connected between the second upper wall and the second lower wall, wherein the second rail includes a plurality of mounting features; and
 a reinforcing member fixedly mounted on the second sidewall of the second rail, the reinforcing member having a first length, the second rail having a second length, the first length being substantially equal to or slightly less than the second length, wherein the reinforcing member includes a plurality of matching features each corresponding to one of the mounting features of the second rail respectively.

10. The slide rail assembly of claim 9, wherein the reinforcing member includes a plurality of reinforcing segments.

11. The slide rail assembly of claim 9, wherein the mounting features of the second rail include a plurality of U-shaped holes and a J-shaped hole, and the J-shaped hole is adjacent to an end of the second rail.

12. The slide rail assembly of claim 11, wherein the matching features of the reinforcing member include a plurality of U-shaped corresponding holes and a J-shaped corresponding hole, and the U-shaped corresponding holes and the J-shaped corresponding hole of the reinforcing member correspond to the U-shaped holes and the J-shaped hole of the second rail respectively in order to be mounted with mounting members arranged on a lateral side of the chassis respectively.

13. The slide rail assembly of claim 9, wherein the second sidewall of the second rail has an inner side and an outer side, the inner side corresponds to the first sidewall of the first rail, and the reinforcing member is fixedly mounted on the inner side of the second sidewall.

14. A slide rail assembly, comprising:
 a first rail having a first upper wall, a first lower wall, and a first sidewall connected between the first upper wall and the first lower wall, wherein the first upper wall, the first lower wall, and the first sidewall jointly define a first passage, an upper supporting strip is connected to an inner side of the first upper wall of the first rail, and the first upper wall of the first rail is provided with a first notch;
 a second rail displaceable with respect to the first passage of the first rail, the second rail having a second upper wall, a second lower wall, and a hole; and
 a longitudinally extended auxiliary supporting member fixedly disposed in the first passage of the first rail, the auxiliary supporting member extending longitudinally along the first rail to increase a flexural strength thereof;
 wherein the upper supporting strip is provided with a second notch corresponding in position to the first notch of the first upper wall of the first rail, the first notch and the second notch correspond to the hole of the second rail, and the upper supporting strip is configured to support the second upper wall of the second rail.

15. The slide rail assembly of claim 14, wherein a lower supporting strip is connected to an inner side of the first lower wall of the first rail and is configured for supporting the second lower wall of the second rail, and the upper and lower supporting strips are two separate members.

16. A slide rail assembly to be mounted with a chassis, wherein the chassis has a lateral side arranged with a plurality of mounting members, the slide rail assembly comprising:
 a first rail having a first upper wall, a first lower wall, and a first sidewall connected between the first upper wall and the first lower wall, wherein the first upper wall, the first lower wall, and the first sidewall jointly define a first passage, an upper supporting strip is connected to an inner side of the first upper wall of the first rail, and the first upper wall of the first rail is provided with a first notch;
 a second rail displaceable with respect to the first passage of the first rail, the second rail having a second upper wall, a second lower wall, and a plurality of holes; and
 a longitudinally extended auxiliary supporting member fixedly disposed in the first passage of the first rail, the auxiliary supporting member extending longitudinally along the first rail to increase a flexural strength thereof;
 wherein the upper supporting strip is provided with a second notch corresponding in position to the first notch of the first upper wall of the first rail, the first notch and the second notch correspond to one of the holes of the second rail to allow one of the mounting members of the chassis to be mounted in the one of the holes of the second rail, and the upper supporting strip is configured to support the second upper wall of the second rail.

17. The slide rail assembly of claim 16, wherein a lower supporting strip is connected to an inner side of the first lower wall of the first rail and is configured for supporting the second lower wall of the second rail, and the upper and lower supporting strips are two separate members.

\* \* \* \* \*